US012683560B2

(12) United States Patent
McLaurin et al.

(10) Patent No.: US 12,683,560 B2

(45) Date of Patent: Jul. 14, 2026

(54) VARIABLE GAIN AMPLIFIERS WITH FINE ATTENUATION STEP CONTROL AND FLAT SIGNAL-TO-NOISE RATIO VERSUS ATTENUATION

(71) Applicant: Analog Devices, Inc., Wilmington, MA (US)

(72) Inventors: David J. McLaurin, Raleigh, NC (US); Kevin Gard, Raleigh, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 478 days.

(21) Appl. No.: 18/335,459

(22) Filed: Jun. 15, 2023

(65) Prior Publication Data

US 2024/0421780 A1     Dec. 19, 2024

(51) Int. Cl.
| | |
|---|---|
| *H03F 3/195* | (2006.01) |
| *H03F 1/56* | (2006.01) |
| *H03G 1/00* | (2006.01) |
| *H03G 3/30* | (2006.01) |

(52) U.S. Cl.
CPC ............. *H03F 3/195* (2013.01); *H03F 1/565* (2013.01); *H03G 1/0088* (2013.01); *H03G 3/3042* (2013.01)

(58) Field of Classification Search
CPC ....... H03F 3/195; H03F 1/565; H03G 1/0088; H03G 3/3042
USPC ........................................................ 330/295
See application file for complete search history.

(56) References Cited

U.S. PATENT DOCUMENTS

| | | | |
|---|---|---|---|
| 4,521,764 | A | 6/1985 | Burton |
| 5,043,675 | A | 8/1991 | Gilbert |
| 5,077,541 | A | 12/1991 | Gilbert |
| 5,339,021 | A | 8/1994 | Thomson |
| 5,572,166 | A | 11/1996 | Gilbert |
| 5,684,431 | A | 11/1997 | Gilbert et al. |

(Continued)

FOREIGN PATENT DOCUMENTS

JP          5093149 B2    12/2012

OTHER PUBLICATIONS

Gu et al., "A DC-43.5 Ghz CMOS Switched-Type Attenuator with Capacitive Compensation Technique" IEEE Asian Solid-State Circuits Conference, Nov. 4-6, 2019, in 2 pages.

(Continued)

*Primary Examiner* — Hafizur Rahman

(74) *Attorney, Agent, or Firm* — Knobbe, Martens, Olson & Bear, LLP

(57)          ABSTRACT

Variable gain amplifiers (VGAs) with fine attenuation step control and flat signal-to-noise ratio (SNR) versus attenuation are provided. In certain embodiments, a VGA includes an input that receives a radio frequency (RF) input signal, a segmented amplification circuit including multiple amplification cells that operate in parallel to amplify the RF input signal to generate multiple amplified RF signals, an impedance ladder including multiple taps each connected to a different node of the impedance ladder, and switches that control routing of the amplified RF signals to one or more selected taps of the impedance ladder. Accordingly, the VGA uses the switches to connect the outputs of the segmented amplification circuit to the selected tap(s) of the impedance ladder. By changing the tap selection, the attenuation step of the VGA is controlled.

20 Claims, 9 Drawing Sheets

(56) References Cited

U.S. PATENT DOCUMENTS

| | | | |
|---|---|---|---|
| 5,757,220 A | | 5/1998 | Murden et al. |
| 6,046,640 A | * | 4/2000 | Brunner ............... H03G 1/0023 |
| | | | 330/311 |
| 6,429,720 B1 | | 8/2002 | Gilbert |
| 6,441,684 B1 | | 8/2002 | Nakamura |
| 6,525,601 B2 | | 2/2003 | Gilbert |
| 6,525,606 B1 | | 2/2003 | Atkinson |
| 6,545,534 B1 | | 4/2003 | Mehr |
| 6,753,732 B1 | | 6/2004 | Moreland |
| 6,807,406 B1 | * | 10/2004 | Razavi ................. H03G 1/0088 |
| | | | 455/313 |
| 6,842,071 B1 | * | 1/2005 | Retz ................... H03F 3/45475 |
| | | | 330/133 |
| 6,894,564 B1 | | 5/2005 | Gilbert |
| 6,972,624 B1 | | 12/2005 | Stroet |
| 7,071,784 B2 | | 7/2006 | Seremeta |
| 7,190,227 B2 | | 3/2007 | Gilbert |
| 7,245,189 B2 | | 7/2007 | Seremeta |
| 7,259,620 B2 | | 8/2007 | Zou |
| 7,262,661 B2 | | 8/2007 | Zou |
| 7,292,100 B1 | | 11/2007 | Ditommaso |
| 7,317,357 B1 | | 1/2008 | Zou |
| 7,495,511 B2 | | 2/2009 | Gilbert et al. |
| 7,504,841 B2 | | 3/2009 | Frame et al. |
| 7,714,658 B1 | | 5/2010 | Striflier |
| 7,728,610 B2 | | 6/2010 | Frame et al. |
| 7,839,233 B2 | | 11/2010 | Zhao et al. |
| 7,843,038 B2 | | 11/2010 | Seremeta |
| 7,990,217 B2 | | 8/2011 | Gilbert et al. |
| 8,731,099 B2 | | 5/2014 | Giannini et al. |
| 8,890,598 B2 | | 11/2014 | Jordan |
| 9,391,577 B2 | | 7/2016 | Stroet |
| 9,553,563 B1 | | 1/2017 | Jordan |
| 9,716,479 B2 | | 7/2017 | Jordan |
| 9,735,738 B2 | | 8/2017 | Aksin |
| 9,813,050 B1 | | 11/2017 | Mcquilkin |
| 10,038,413 B2 | | 7/2018 | Lee et al. |
| 10,103,712 B2 | | 10/2018 | Othman et al. |
| 10,950,542 B2 | | 3/2021 | Steigerwald et al. |
| 2007/0176665 A1 | | 8/2007 | Zhang et al. |
| 2012/0206201 A1 | * | 8/2012 | Mizokami ........... H03F 3/45179 |
| | | | 330/254 |
| 2014/0002194 A1 | * | 1/2014 | Bult ........................ H03G 3/30 |
| | | | 330/254 |

OTHER PUBLICATIONS

Gu et al., "A DC-50 GHz CMOS Switched-Type Attenuator With Capacitive Compensation Technique" IEEE Transactions on Circuits and Systems-I: Regular Papers, vol. 67, No. 10, Oct. 2020, in 11 pages.

Gao et al., "A DC-87.8-GHz Switched-Type Attenuator With Switched Capacitor Branch in 40-nm CMOS" IEEE Transactions on Circuits and Systems-II: Express Briefs, vol. 70, No. 9, Sep. 2023, in 5 pages.

Mayer et al., "A direct-conversion transmitter for small-cell cellular base stations with integrated digital predistortion in 65nm CMOS" IEEE Xplore, downloaded Sep. 7, 2023, in 4 pages.

McLaurin et al., "A Highly Reconfigurable 65nm CMOS RF-to-Bits Transceiver for Full-Band Multicarrier TDD/FDD 2G/3G/4G/5G Macro Basestations" IEEE International Solid-State Circuits Conference, Feb. 13, 2018, in 3 pages.

Nguyen et al., "Low-loss 6-bit Sub-7 GHz Digital Step Attenuator" IEEE Xplore, downloaded Sep. 7, 2023, in 6 pages.

* cited by examiner

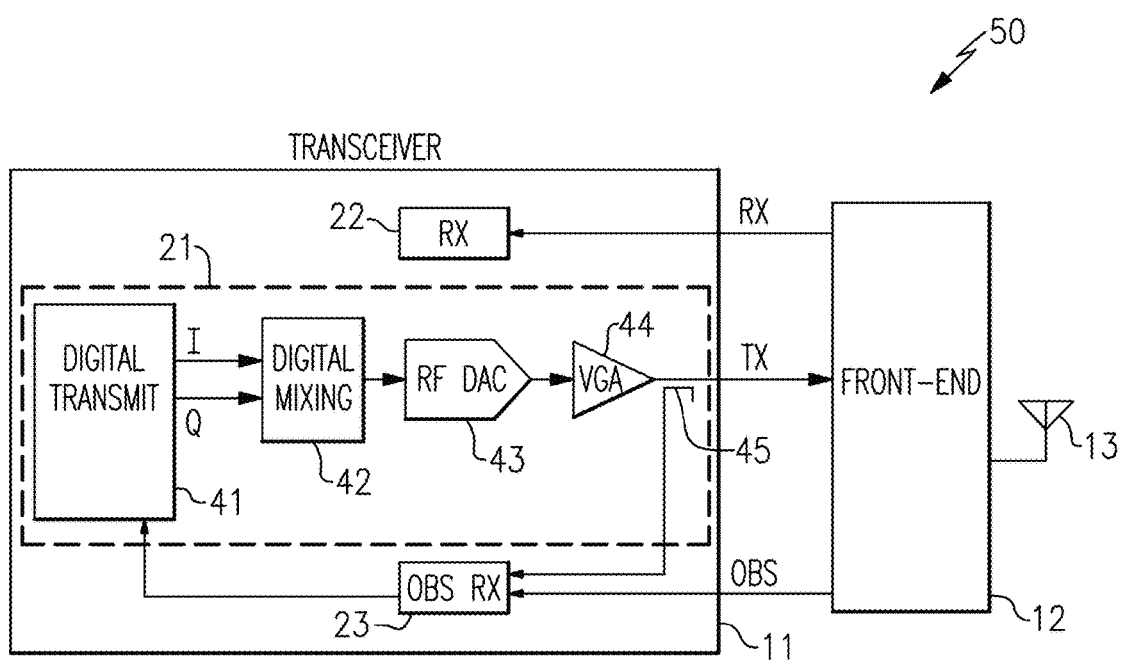
_FIG.1_
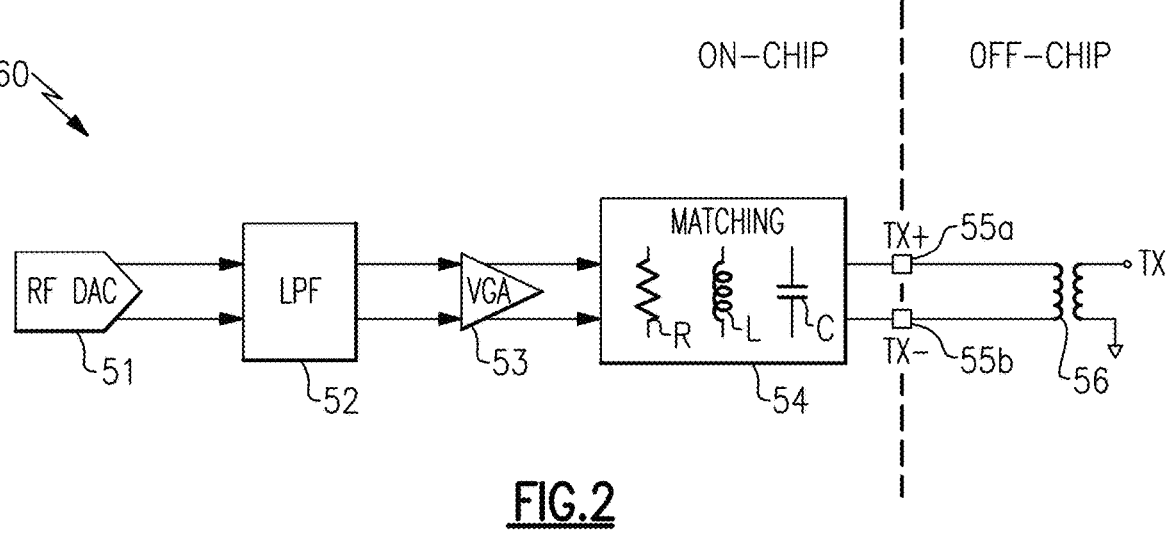
_FIG.2_

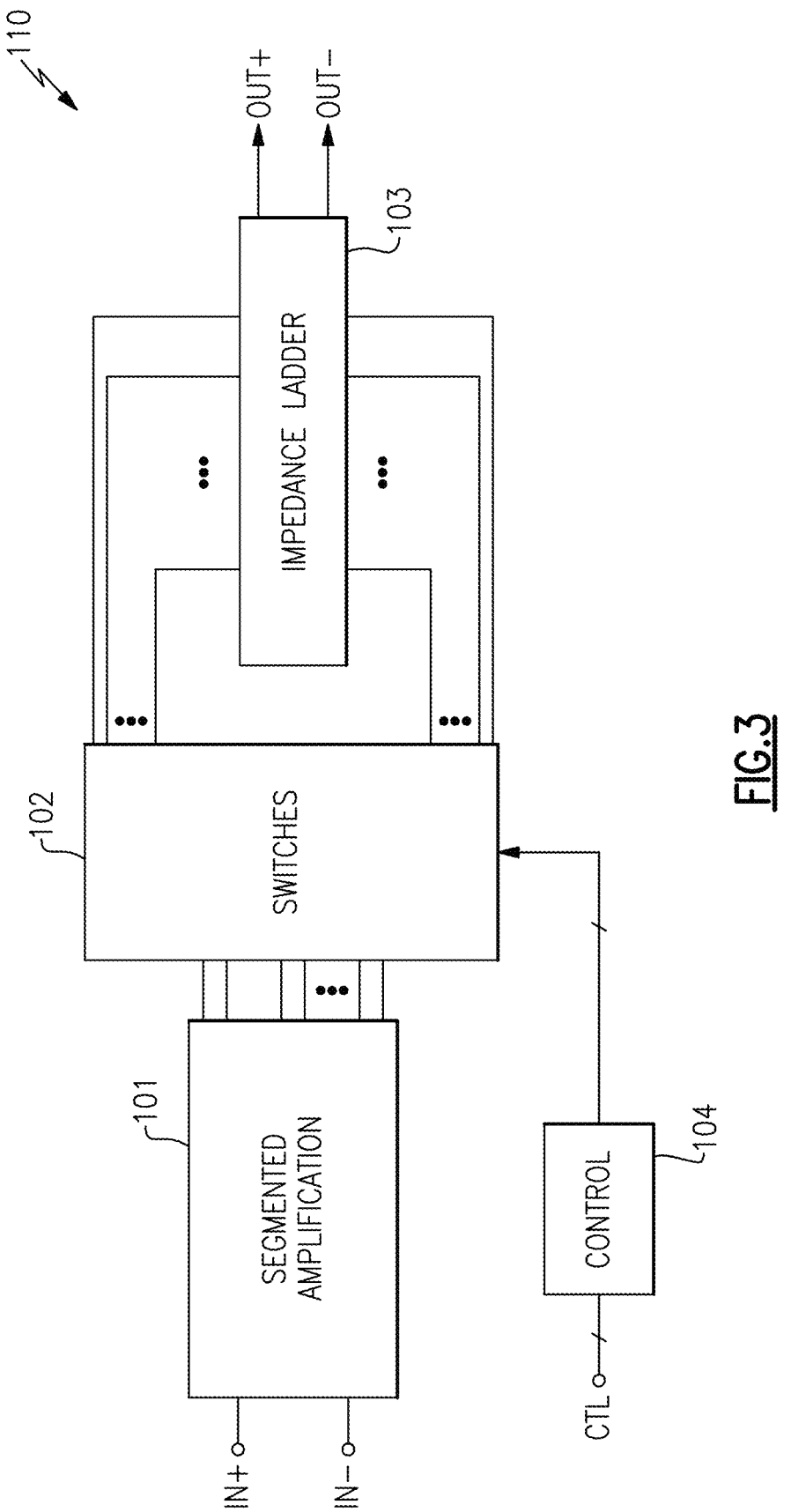
_FIG.3_

VARIABLE GAIN AMPLIFIERS WITH FINE ATTENUATION STEP CONTROL AND FLAT SIGNAL-TO-NOISE RATIO VERSUS ATTENUATION

FIELD OF THE DISCLOSURE

Embodiments of the invention relate to electronic systems, and more particularly, to variable gain amplifiers.

BACKGROUND

Variable gain amplifiers (VGAs) are used in a wide range of applications including communications, medical, industrial, military, and/or sensing. For instance, cellular communications equipment, radar systems, lidar systems, and ultrasound equipment are a few examples of electronic systems that can include VGAs for providing gain control of signals to enhance dynamic performance.

In one example, a radio transceiver includes a VGA in a transmit path, thereby providing power control of wireless transmissions. In another example, a radio transceiver includes a VGA in a receive path to allow for adjustment of the power of signals wirelessly received from an antenna. Including a VGA in transmit path and/or receive path of a radio transceiver aids in achieving a desired signal power level for a given RF operating environment and/or communication distance.

SUMMARY OF THE DISCLOSURE

Variable gain amplifiers (VGAs) with fine attenuation step control and flat signal-to-noise ratio (SNR) versus attenuation are provided. In certain embodiments, a VGA includes an input that receives a radio frequency (RF) input signal, a segmented amplification circuit including multiple amplification cells that operate in parallel to amplify the RF input signal to generate multiple amplified RF signals, an impedance ladder including multiple taps each connected to a different node of the impedance ladder, and switches that control routing of the amplified RF signals to one or more selected taps of the impedance ladder. Accordingly, the VGA uses the switches to connect the outputs of the segmented amplification circuit to the selected tap(s) of the impedance ladder. By changing the tap selection, the attenuation step of the VGA is controlled.

In one aspect, a VGA includes an input configured to receive an RF input signal, a segmented amplification circuit including a plurality of amplification cells configured to amplify the RF input signal to generate a plurality of amplified RF signals, an impedance ladder including a plurality of taps each connected to a different node of the impedance ladder, and a plurality of switches configured to control routing of the plurality of amplified RF signals to one or more taps selected from the plurality of taps of the impedance ladder.

In another aspect, a method of variable gain amplification includes receiving an RF input signal at an input of a VGA, amplifying the RF input signal using a plurality of amplification cells of a segmented amplification circuit of the VGA to generate a plurality of amplified RF signals, selecting one or more taps from a plurality of taps of an impedance ladder of the VGA, and routing the plurality of amplified RF signals to the one or more selected taps using a plurality of switches of the VGA.

In another aspect, a transmitter includes an RF digital-to-analog converter (DAC) configured to convert a digital input signal into an RF input signal, and a VGA. The VGA includes an input configured to receive the RF input signal, a segmented amplification circuit including a plurality of amplification cells configured to amplify the RF input signal to generate a plurality of amplified RF signals, an impedance ladder including a plurality of taps each connected to a different node of the impedance ladder, and a plurality of switches configured to control routing of the plurality of amplified RF signals to one or more taps selected from the plurality of taps of the impedance ladder.

In another aspect, a VGA includes an input configured to receive an RF input signal and an impedance ladder including a plurality of taps each connected to a different node of the impedance ladder. The plurality of taps includes a first tap and a second tap. The VGA further includes a first segmented amplification circuit including a first plurality of amplification cells connected in parallel between the input and the first tap, the first segmented amplification circuit configured to amplify the RF input signal. The VGA further includes a second segmented amplification circuit including a second plurality of amplification cells connected in parallel between the input and the second tap, the second segmented amplification circuit configured to amplify the RF input signal.

In another aspect, a method of variable gain amplification includes receiving an RF input signal at an input of a VGA and amplifying the RF input signal using a first segmented amplification circuit of the VGA, wherein the first segmented amplification circuit includes a first plurality of amplification cells connected in parallel between the input and a first tap of an impedance ladder of the VGA. The method further includes amplifying the RF input signal using a second segmented amplification circuit of the VGA, wherein the second segmented amplification circuit includes a second plurality of amplification cells connected in parallel between the input and a second tap of the impedance ladder.

In another aspect, a transmitter includes a VGA and an RF DAC configured to convert a digital input signal into an RF input signal. The VGA includes an input configured to receive the RF input signal and an impedance ladder including a plurality of taps each connected to a different node of the impedance ladder, the plurality of taps including a first tap and a second tap. The VGA further includes a first segmented amplification circuit including a first plurality of amplification cells connected in parallel between the input and the first tap, the first segmented amplification circuit configured to amplify the RF input signal. The VGA further includes a second segmented amplification circuit including a second plurality of amplification cells connected in parallel between the input and the second tap, the second segmented amplification circuit configured to amplify the RF input signal.

BRIEF DESCRIPTION OF THE DRAWINGS

FIG. 1 is a schematic diagram of one embodiment of a radio frequency (RF) communications system.

FIG. 2 is a schematic diagram of one embodiment of a transmit path for a transceiver.

FIG. 3 is a schematic diagram of a variable gain amplifier (VGA) according to one embodiment.

DETAILED DESCRIPTION OF EMBODIMENTS

Figure 4A:
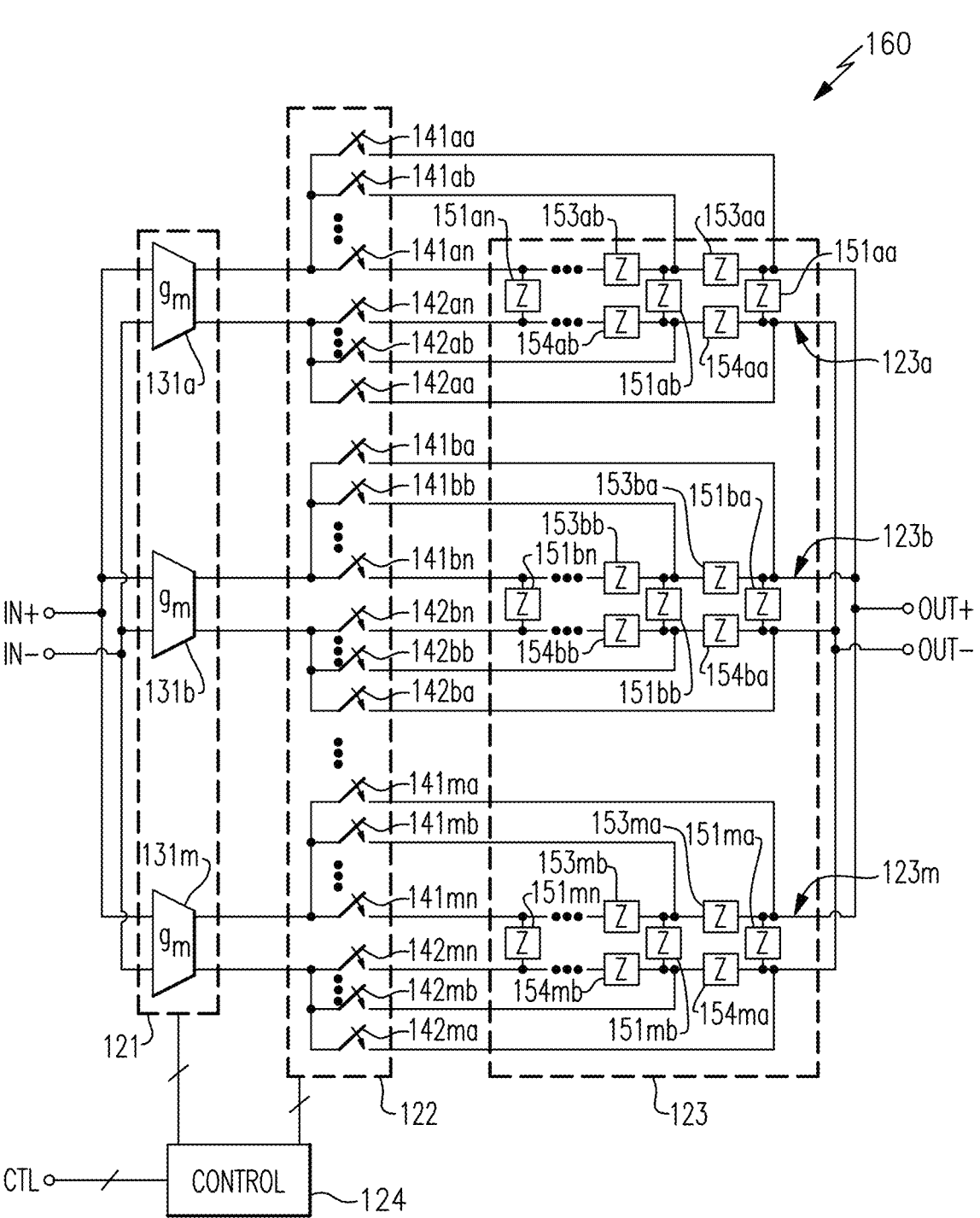
FIG. 4A is a schematic diagram of a VGA according to another embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In certain applications, it is desirable for a VGA to provide small attenuation steps. For example, certain transceivers for cellular infrastructure need significant gain control (>20 dB) to accommodate variability in the power amplifier and/or power amplifier driver gain versus process, voltage, and/or temperature (PVT). Thus, gain control for such applications can be specified to control the power at the antenna with attenuation steps of no larger than 0.05 dB. Furthermore, such systems can be specified to operate with very low output noise spectral density (NSD) to meet stringent spectral emissions requirements.

Conventional VGA architectures fail to provide both fine attenuation step control and good NSD versus attenuation. For example, digitally-stepped attenuators (DSAs) using resistor ladders for attenuation suffer from significant gain step differential non-linearity (DNL). In another example, VGAs using a segmented transconductor provide fine attenuation step control, but suffer from noise performance that degrades significantly versus attenuation as segments are disabled and the VGA output signal drops faster than the VGA noise.

VGAs with fine attenuation step control and flat signal-to-noise ratio (SNR) versus attenuation are provided. In certain embodiments, a VGA includes an input that receives an RF input signal, a segmented amplification circuit including multiple amplification cells that operate in parallel to amplify the RF input signal to generate multiple amplified RF signals, an impedance ladder including multiple taps each connected to a different node of the impedance ladder, and switches that control routing of the amplified RF signals to one or more selected taps of the impedance ladder.

Accordingly, the VGA uses the switches to connect the outputs of the segmented amplification circuit to the selected tap(s) of the impedance ladder. By changing the tap selection, the attenuation step or setting of the VGA is controlled.

In certain implementations, all of the amplification cells remain active as the attenuation setting is changed across a range of attenuation settings. Thus, instead of individually enabling and disabling the amplification cells to provide gain control, all of the amplification cells can remain active and attenuation steps for gain control are provided by changing the tap selection.

By implementing the VGA in this manner, both fine attenuation step control and flat SNR are provided. For example, by maintaining all of the amplification cells enabled across a range of attenuation settings, the SNR remains substantially constant versus attenuation. Furthermore, the number of taps and/or amplification cells can be chosen to achieve very small gain steps. Flat SNR is also referred to herein as near constant SNR or substantially constant SNR.

Accordingly, the VGA can exhibit small gain steps suitable for advanced cellular transceiver applications while also providing near constant VGA input-referred NSD down to the thermal floor. In contrast, conventional VGAs suffer from poor gain control characteristics and/or input-referred NSD that increases significantly with attenuation.

Such VGA characteristics are particular beneficial for applications in which a VGA consumes a significant portion of a noise budget. For example, a VGA can consume a significant portion of a transmit (TX) noise budget in an RF sampling transmitter architecture in which an RF digital-to-analog converter (DAC) provides frequency upconversion without the need of an analog mixer.

The VGAs herein can be used to amplify RF signals of a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

Moreover, the RF signals amplified by the VGAs herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

FIG. 1 is a schematic diagram of one embodiment of an RF communication system 50. The RF communication system 50 includes a transceiver 11, a front-end system 12, and an antenna 13.

As shown in FIG. 1, the transceiver 11 provides an RF transmit signal TX to the front-end system 12, and receives an RF receive signal RX and an observation signal OBS from the front-end system 12. Although not shown in FIG. 1, additional signals can be communicated between the transceiver 11 and the front-end system 12, such as control signals, additional receive signals, additional transmit signals, and/or additional observation signals.

In the illustrated embodiment, the transceiver 11 includes a transmitter 21, a receiver 22, and an observation receiver 23. The transmitter 21 generates the RF transmit signal TX, while the receiver 22 processes the RF receive signal RX. Additionally, the observation receiver 23 processes the observation signal OBS, which indicates observations of the RF transmit signal TX after amplification by the front-end system's power amplifier.

In certain implementations, the transceiver 11 is formed on a semiconductor die or chip. The transceiver 11 depicts one example of an electronic circuit that can include one or more VGAs implemented in accordance with the teachings herein. Although one example application for VGAs is shown, the VGAs disclosed herein can be used in a wide range of electronic systems.

As shown in FIG. 1, the transmitter 21 includes a digital transmit circuit 41, a digital mixing circuit 42, an RF DAC 43, a VGA 44, and a directional coupler 45. Although the transceiver 11 is depicted as including one VGA, the transceiver 11 can include additional VGAs, such as additional VGAs in the transmitter 21, the receiver 22, and/or the observation receiver 23.

In the illustrated embodiment, the digital transmit circuit 41 generates a digital I signal and a digital Q signal, which correspond to a quadrature representation of the RF transmit signal TX. The digital transmit circuit 41 can provide a wide variety of types of processing to the digital I signal and the digital Q signal, such as digital-predistortion (DPD), digital filtering, crest factor reduction, and/or power control.

As shown in FIG. 1, the observation receiver 23 processes a local observation signal from the directional coupler 45 and the observation signal OBS from the front end system 12 to generate observation data that is provided to the digital transmit circuit 41. The observation data can be used for a wide variety of functions including, but not limited to, DPD training and/or transmit power control. Although one example implementation for generating observation data is shown, other implementations are possible, such as configurations in which the directional coupler 45 is omitted.

The digital mixing circuit 42 provides digital up-conversion of the I signal and the Q signal to generate a digital representation of an upconverted transmit signal, which is processed by the RF DAC 43 to generate an RF input signal for the VGA 44. Thus, the transmitter 21 performs mixing in the digital domain prior to digital-to-analog conversion by the RF DAC 43. The RF input signal is amplified by the VGA 44 to generate the RF transmit signal TX.

The VGA 44 can be implemented in accordance with the teachings herein to provide both fine attenuation step control and flat SNR versus attenuation. Accordingly, the VGA can exhibit small attenuation steps suitable for advanced cellular transceiver applications while also providing near constant VGA input-referred NSD down to the thermal floor.

Such VGA characteristics are particular beneficial for applications in which a VGA consumes a significant portion of a TX noise budget, such as for the RF sampling transmitter 21 of FIG. 1.

FIG. 2 is a schematic diagram of one embodiment of a transmit path for a transceiver 60. In the illustrated embodiment, the transceiver 60 includes an RF DAC 51, a low-pass filter (LPF) 52, a VGA 53, and an output impedance matching circuit 54 formed on a common semiconductor chip or die. For clarity of the figure, only certain components of the transceiver 60 are shown. However, the transceiver 60 can include further components, such as those used for transmit, receive, observation, and/or control.

The transmit path is implemented differentially, in this example, and thus the RF DAC 51, the LPF 52, the VGA 53, and the output impedance matching circuit 54 are each implemented as differential components. Furthermore, the transceiver 60 includes a pair of transmit pins 55a/55b for providing the RF output signal to a balun 56 that is external to the transceiver 60. The balun 60 provides differential to single-ended signal conversion to thereby convert the RF output signal (which includes a non-inverted component TX+ and an inverted component TX−) into a single-ended RF transmit signal TX that is provided to an RF front end (for example, the RF front end 12 of FIG. 1).

In the illustrated embodiment, the LPF 52 is included between the RF DAC 51 and the VGA 53 and serves to filter the RF input signal from the RF DAC 51. The VGA 53 amplifies the RF input signal after filtering to generate an RF output signal that is provided to the output impedance matching circuit 54.

As shown in FIG. 2, the output impedance matching circuit 54 includes resistive (R), inductive (L), and/or capacitive (C) components for providing impedance matching. In certain implementations, the VGA 53 includes an impedance ladder at the VGA's output that operates in combination with the R, L, and/or C components of the output impedance matching circuit 54 to provide proper termination for the transmit pins 55a/55b. Thus, the impedance ladder of the VGA 53 can be co-designed with the output impedance matching circuit 54, in certain implementations.

FIG. 3 is a schematic diagram of a VGA 110 according to one embodiment. The VGA 110 includes a segmented amplification circuit 101, switches 102, an impedance ladder 103, and a control circuit 104. The VGA 110 receives an RF input signal from a differential input IN+/IN−, and provides an RF output signal to a differential output OUT+/OUT−. The VGA 110 also receives a digital control signal (for example, multiple digital bits) on a control input CTL. The control circuit 104 processes the digital control signal to operate the VGA 110 with a selected attenuation setting chosen from multiple attenuation settings spanning an attenuation range of the VGA 110. An attenuation setting is also referred to herein as a gain setting.

The segmented amplification circuit 101 includes multiple amplification cells that operate in parallel to amplify the RF input signal to generate a plurality of amplified RF signals that are provided to the switches 102.

In certain implementations, the multiple amplification cells correspond to transconductor circuits such that the segmented amplification circuit 101 is a segmented transconductor used to provide voltage-to-current conversion. For example, the RF input signal can correspond to an RF input voltage, while the amplified RF signals outputted by the segmented amplification circuit 101 can correspond to output currents. Implementing the segmented amplification circuit 101 to generate output currents reduces the linearity impact caused by the presence of the switches 102 in the signal path relative to a configuration using output voltages.

With continuing reference to FIG. 3, the impedance ladder 103 includes multiple taps associated with different impedances through the impedance ladder 103 to the differential output OUT+/OUT−. In this example, the taps are implemented differentially.

The switches 102 control routing of the amplified RF signals to one or more taps selected from the taps of the impedance ladder 103. Each tap of the impedance ladder 103 is connected to a different node of the impedance ladder 103. The selected tap(s) are chosen by the control circuit 104 based on the desired attenuation setting indicated by the digital control signal received on the control input CTL. Accordingly, the VGA 110 uses the switches 102 to connect the outputs of the segmented amplification circuit 101 to the selected tap(s) of the impedance ladder 103. By changing the tap selection, the attenuation step of the VGA 110 is controlled.

In certain implementations, all of the amplification cells of the segmented amplification circuit 101 remain active as the attenuation step is varied across the attenuation setting range. Thus, instead of providing gain control by individually enabling and disabling the amplification cells, all of the amplification cells can remain active and gain control is provided by changing the tap selection.

By implementing the VGA 110 in this manner, both fine attenuation step control and flat SNR are achieved. For example, by maintaining all of the amplification cells enabled across attenuation setting, the SNR remains substantially constant versus attenuation. Furthermore, the number of taps and/or amplification cells can be chosen to achieve very small gain steps.

Accordingly, the VGA 110 can exhibit small gain steps suitable for advanced cellular transceiver applications while also providing near constant VGA input-referred NSD down to the thermal floor. In contrast, conventional VGAs suffer from poor gain control characteristics and/or input-referred NSD that increases significantly with attenuation.

FIG. 4A is a schematic diagram of a VGA 160 according to another embodiment. The VGA 160 includes a segmented amplification circuit 121, switches 122, an impedance ladder 123, and a control circuit 124. The VGA 160 receives an RF input signal from a differential input IN+/IN−, and provides an RF output signal to a differential output OUT+/OUT−. The VGA 160 also receives a digital control signal on a control input CTL.

The segmented amplification circuit 121 includes a plurality amplification cells 131a, 131b, . . . 131m that operate in parallel to amplify the RF input signal to generate a plurality of amplified RF signals that are provided to the switches 122. The amplification cells are implemented as transconductor ($g_m$) circuits, in this embodiment. Thus, the segmented amplification circuit is a segmented transconductor in this embodiment. Such as segmented transconductor can include transistors, such as field-effect transistors (FETs) or bipolar transistors providing voltage to current conversion. Any integer m amplification cells can be included, where m is greater than or equal to 2. In certain implementations m is at least 4.

With continuing reference to FIG. 4A, the impedance ladder 123 includes a plurality of taps associated with different impedances through the impedance ladder 123 to the differential output OUT+/OUT−. Each tap is connected to a different node of the impedance ladder 123. In this example, impedance ladder 123 is segmented into a plurality of impedance ladder segments 123a, 123b, . . . 123m each of which are connected to a corresponding one of the amplification cells 131a, 131b, . . . 131m through the switches 122. The taps of the impedance ladder segments 123a, 123b, . . . 123m are differential, in this example.

As shown in FIG. 4A, the impedance ladder segment 123a includes first impedances 153aa/153ab, second impedances 154aa/154ab, and third impedances 151aa, 151ab, . . . 151an. Additionally, the impedance ladder segment 123b includes first impedances 153ba/153bb, second impedances 154ba/154bb, and third impedances 151ba, 151bb, . . . 151bn. Furthermore, the impedance ladder segment 123m includes first impedances 153ma/153mb, second impedances 154ma/154mb, and third impedances 151ma, 151mb, . . . 151mn. The impedances can include resistor, capacitor, and/or inductive components. The impedances can have uniform values or different values to achieve a desired weighting scheme.

The impedance ladder can include any number of impedances and taps. For example, an integer n number of taps can be included, where n is greater than equal or 2. The number of taps n can be the same or different from the number of amplification cells m.

The switches 122 control routing of the amplified RF signals to one or more taps selected from the taps of the impedance ladder 123. The selected tap(s) are chosen by the control circuit 124 based on the desired attenuation setting indicated by the digital control signal received on the control input CTL. Accordingly, the VGA 160 uses the switches 122 to connect the outputs of the segmented amplification circuit 121 to the selected tap(s) of the impedance ladder 123. By changing the tap selection, the attenuation step of the VGA 160 is controlled.

In the illustrated embodiment, the switches 122 includes switches 141aa/142aa for routing the output signal of the amplification cell 131a to the first tap of the impedance ladder segment 123a, switches 141ab/142ab for routing the output signal of the amplification cell 131a to the second tap of the impedance ladder segment 123a, and switches 141an/142an for routing the output signal of the amplification cell 131a to the nth tap of the impedance ladder segment 123a. Any suitable number of taps n can be chosen for the impedance ladder segments.

With continuing reference to FIG. 4A, the switches 122 includes switches 141ba/142ba for routing the output signal of the amplification cell 131b to the first tap of the impedance ladder segment 123b, switches 141bb/142bb for routing the output signal of the amplification cell 131b to the second tap of the impedance ladder segment 123b, and switches 141bn/142bn for routing the output signal of the amplification cell 131b to the nth tap of the impedance ladder segment 123b. Furthermore, the switches 122 includes switches 141ma/142ma for routing the output signal of the amplification cell 131m to the first tap of the impedance ladder segment 123m, switches 141mb/142mb for routing the output signal of the amplification cell 131m to the second tap of the impedance ladder segment 123m, and switches 141mn/142mn for routing the output signal of the amplification cell 131m to the nth tap of the impedance ladder segment 123m. Any suitable number of amplification cells m can be included.

The control circuit 124 processes the digital control signal to operate the VGA 160 with a selected attenuation setting chosen from multiple attenuation settings. The attenuation setting can be chosen based on controlling the switches 122 (for example, individually opening or closing each of the depicted switches) to achieved the desired tap selection, which can be the same or different for each of the amplification cells 131a, 131b, . . . 131m. The control circuit 124 can also be used to control the segmented amplification circuit 121, such as to control the gain level of the amplification cells 131a, 131b, . . . 131m, to individually turn on or off the amplification cells 131a, 131b, . . . 131m if desired, and/or to provide individual adjustments to the amplification cells 131a, 131b, . . . 131m to account for mismatch and/or PVT variation.

Figure 4B:
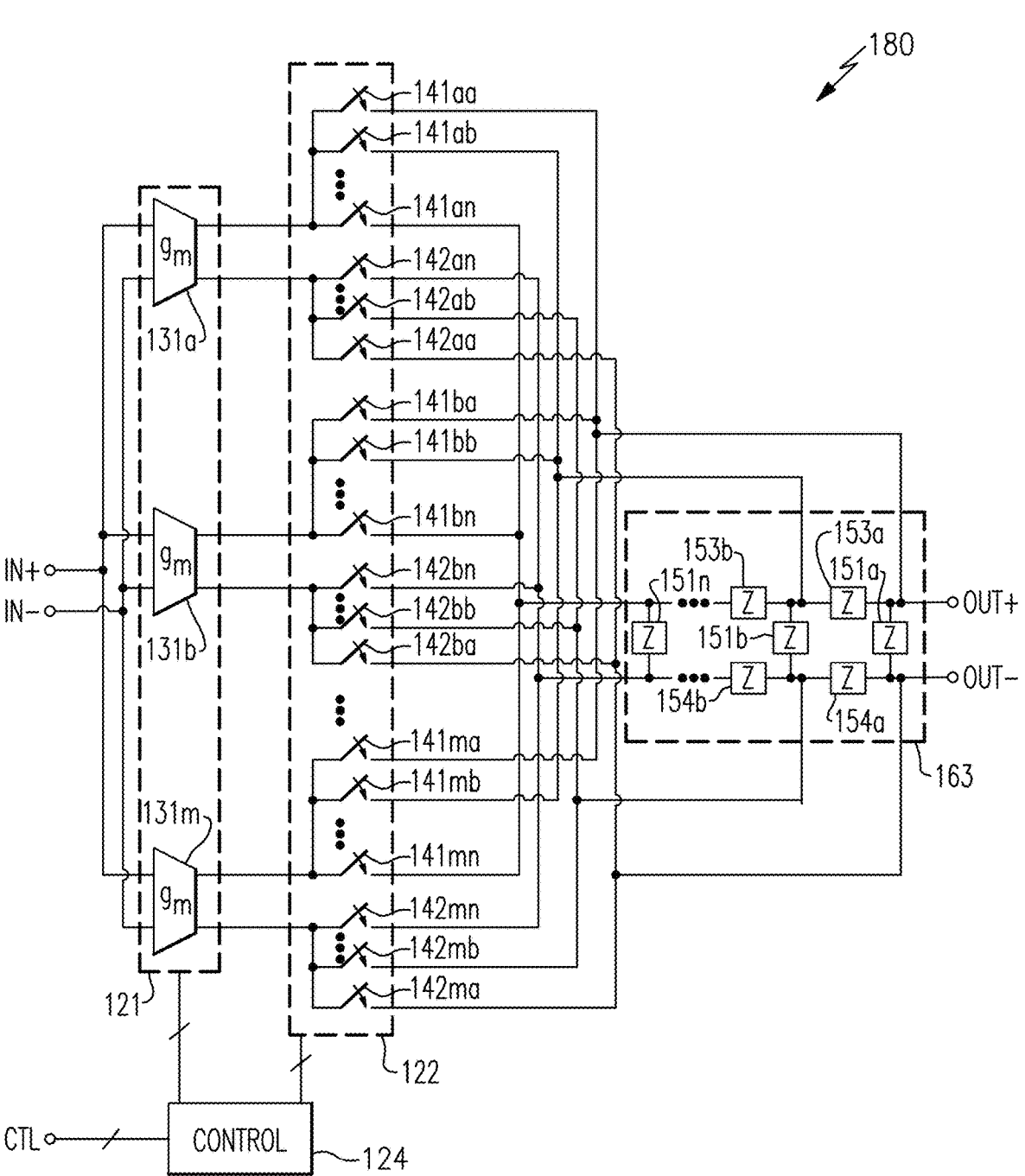
FIG. 4B is a schematic diagram of a VGA according to another embodiment.

FIG. 4B is a schematic diagram of a VGA 180 according to another embodiment. The VGA 180 includes a segmented amplification circuit 121, switches 122, an impedance ladder 163, and a control circuit 124. The VGA 180 receives an RF input signal from a differential input IN+/IN−, and provides an RF output signal to a differential output OUT+/OUT−. The VGA 180 also receives a digital control signal on a control input CTL.

The VGA 180 of FIG. 4B is similar to the VGA 160 of FIG. 4A, except that the VGA 180 of FIG. 4B includes an impedance ladder 163 that is not segmented. As shown in FIG. 4B, the impedance ladder 163 includes first impedances 153a/153b, second impedances 154a/154b, and third impedances 151a, 151b, . . . 151n. When the first tap is selected the impedance 151a provides signal attenuation. Additionally, when the second tap is selected both the impedance 151a and the impedance 151b provide signal attenuation. Furthermore, when the nth tap is selected each of the impedances 151a, 151b, . . . 151n provide signal attenuation. Each tap is connected to a different node of the impedance ladder 163. The taps are differential, in this embodiment.

The switches 141aa/142aa route the output signal of the amplification cell 131a to the first tap of the impedance ladder 163, the switches 141ab/142ab route the output signal of the amplification cell 131a to the second tap of the impedance ladder 163, and the switches 141an/142an route the output signal of the amplification cell 131a to the nth tap of the impedance ladder 163. Additionally, the switches 141ba/142ba route the output signal of the amplification cell 131b to the first tap of the impedance ladder 163, the switches 141bb/142bb route the output signal of the amplification cell 131b to the second tap of the impedance ladder 163, and the switches 141bn/142bn route the output signal of the amplification cell 131b to the nth tap of the impedance ladder 163. Furthermore, the switches 141ma/142ma route the output signal of the amplification cell 131m to the first tap of the impedance ladder 163, the switches 141mb/142mb route the output signal of the amplification cell 131m to the second tap of the impedance ladder 163, and the switches 141mn/142mn route the output signal of the amplification cell 131m to the nth tap of the impedance ladder 163.

Figure 5A:
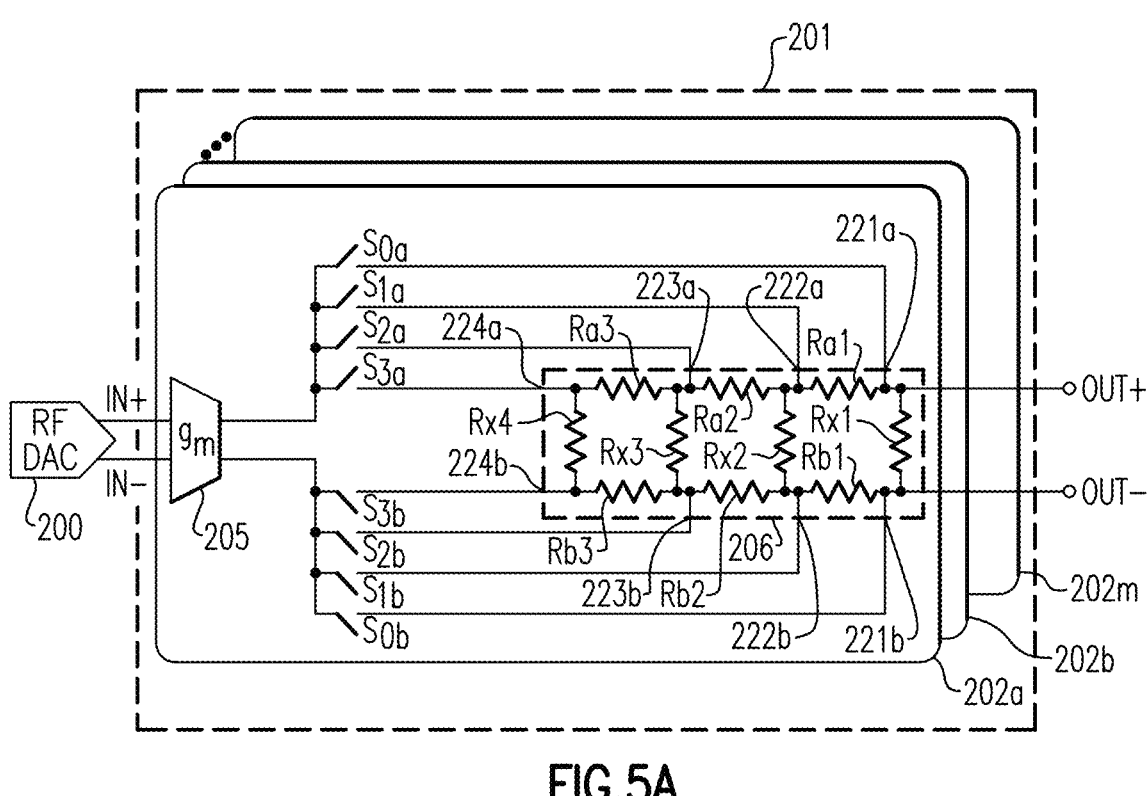
FIG. 5A is a schematic diagram of a radio frequency (RF) digital-to-analog converter (DAC) and VGA according to another embodiment.

FIG. 5A is a schematic diagram of an RF DAC 200 and VGA 201 according to another embodiment. The RF DAC 200 provides an RF input signal to a differential input IN+/IN– of the VGA 201. Additionally, the VGA 201 provides an RF output signal to a differential output OUT+/OUT–.

The VGA 201 includes a plurality of VGA segments 202a, 202b, . . . 202m each including a transconductor circuit 205, a first pair of switches $S_{0a}/S_{0b}$, a second pair of switches $S_{1a}/S_{1b}$, a third pair of switches $S_{2a}/S_{2b}$, a fourth pair of switches $S_{3a}/S_{3b}$, and an impedance ladder segment 206. The impedance ladder segment 206 includes resistors Ra1, Ra2, Ra3, Rb1, Rb2, Rb3, Rx1, Rx2, Rx3, and Rx4 arranged in an R2R configuration. Each impedance ladder segment 206 includes a first tap 221a/221b, a second tap 222a/222b, a third tap 223a/223b, and a fourth tap 224a/224b. Each tap is connected to a different node of the impedance ladder segment 206, and is implemented differentially. Although not shown in FIG. 5A, the VGA 201 can also include other components including, but not limited to, a control circuit for controlling the switches to achieve a desired attenuation setting.

With continuing reference to FIG. 5A, each of the VGA segments 202a, 202b, . . . 202m can be switched to a selected tap of a corresponding impedance ladder segment 206 to thereby achieve a desired attenuation setting.

In one embodiment, all VGA segments 202a, 202b, . . . 202m connect to the first tap 221a/221b at maximum gain. Gain is reduced by sequentially switching each VGA segment from the first tap 221a/221b to the second tap 222a/222b. Once all segments are at the second tap 222a/222b, the process can repeat to reduce gain by sequentially switching each VGA segment from the second tap 222a/222b to the third tap 223a/223b. Furthermore, once all segments are at the third tap 223a/223b, the process can repeat to reduce gain by sequentially switching each VGA segment from the third tap 223a/223b to the fourth tap 224a/224b.

In certain implementations, $$\text{gain} = g_m * R_L \sum_{k=1}^{N} \alpha^{-s_k},$$

$s \in \{0, 1, 2, 3, . . . \}$, where $\alpha$ is the attenuation per tap and $R_L$ is the resistance of each ladder resistor (for an example in which the ladder uses uniform resistor weighting). The selection of the number of taps in the VGA design is a tradeoff between complexity and SNR flatness.

Figure 5B:
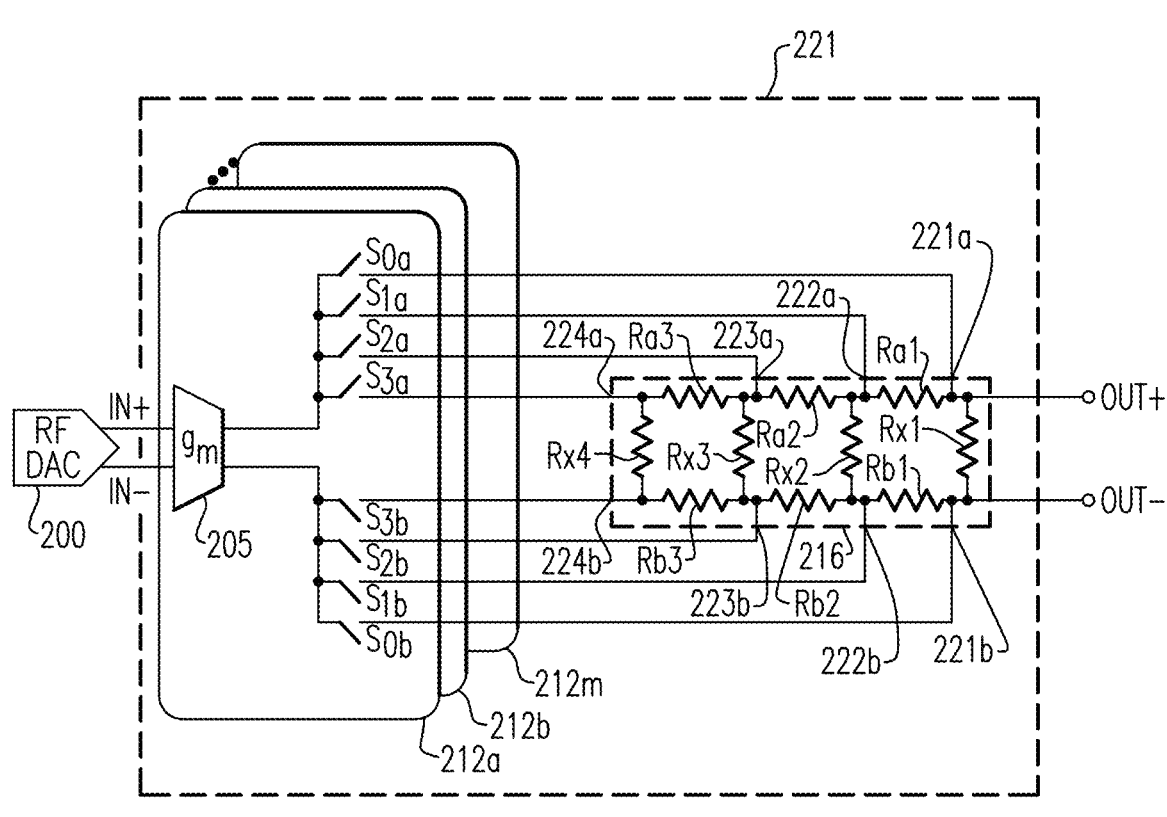
FIG. 5B is a schematic diagram of an RF DAC and VGA according to another embodiment.

FIG. 5B is a schematic diagram of a VGA 221 according to another embodiment. The RF DAC 200 provides an RF input signal to a differential input IN+/IN– of the VGA 221. Additionally, the VGA 221 provides an RF output signal to a differential output OUT+/OUT–.

The VGA 221 includes a plurality of VGA segments 212a, 212b, . . . 212m each including a transconductor circuit 205, a first pair of switches $S_{0a}/S_{0b}$, a second pair of switches $S_{1a}/S_{1b}$, a third pair of switches $S_{2a}/S_{2b}$, and a fourth pair of switches $S_{3a}/S_{3b}$. The VGA segments 212a, 212b, . . . 212m share a common impedance ladder 216 that includes a first tap 221a/221b, a second tap 222a/222b, a third tap 223a/223b, a fourth tap 224a/224b, and resistors Ra1, Ra2, Ra3, Rb1, Rb2, Rb3, Rx1, Rx2, Rx3, and Rx4. Each tap is connected to a different node of the impedance ladder 216. Although not shown in FIG. 5B, the VGA 221 can also include other components including, but not limited to, a control circuit for controlling the switches to achieve a desired attenuation setting.

Thus, the VGA 221 of FIG. 5B is similar to the VGA 201 of FIG. 5A, except that the VGA 221 of FIG. 5B includes a resistive attenuation ladder that is not segmented.

Figure 6A:
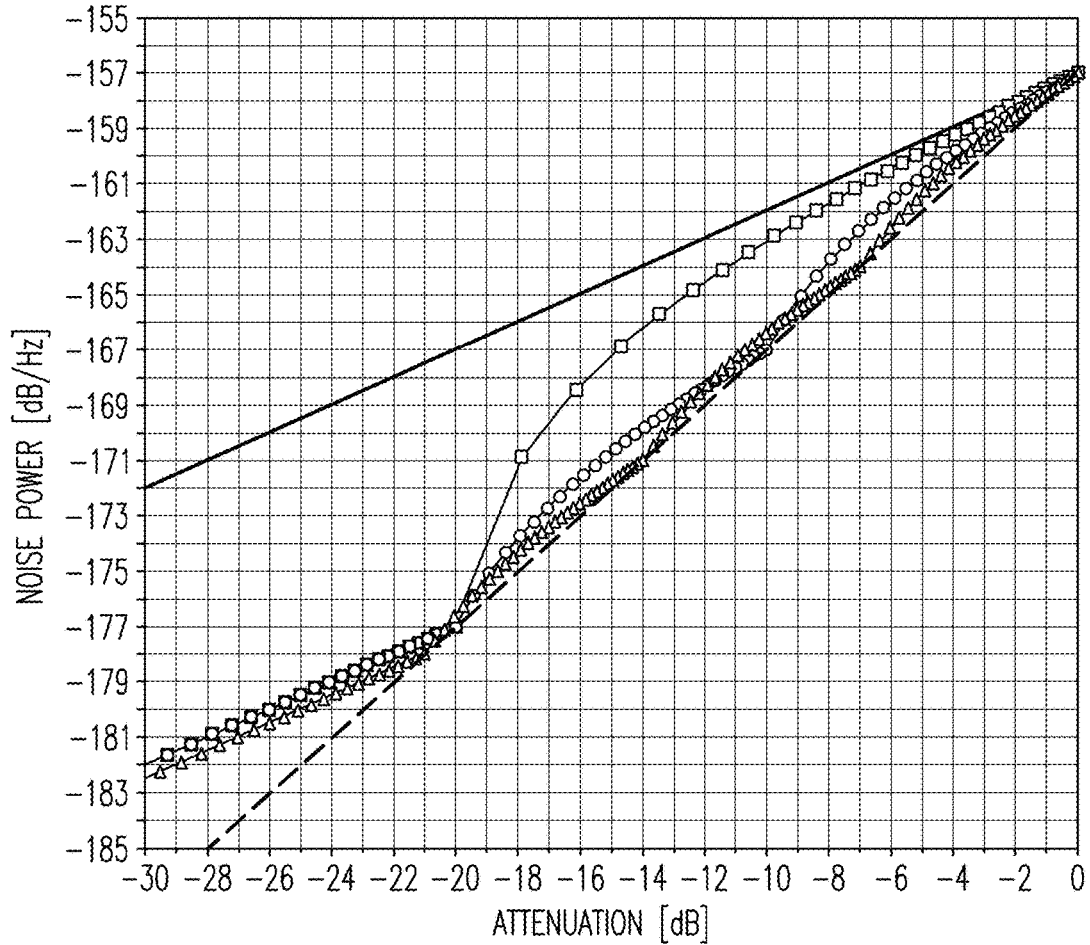
FIG. 6A is a graph of noise power versus attenuation for various examples of VGAs.

FIG. 6A is a graph of noise power versus attenuation for various examples of VGAs. The graph depicts noise power of a VGA 1-tap attenuator, a VGA 2-tap attenuator, a VGA 3-tap attenuator, and a VGA 4-tap attenuator in dB/Hz versus attenuation. As the number of taps increases, the VGA noise scaling more closely approaches 20×LOG(attenuation), which corresponds to the attenuation at the maximum attenuation tap of the impedance ladder in this example. Beyond 20 dB attenuation the noise scaling approaches 10×LOG(attenuation) as slices of the VGA are turned off.

Figure 6B:
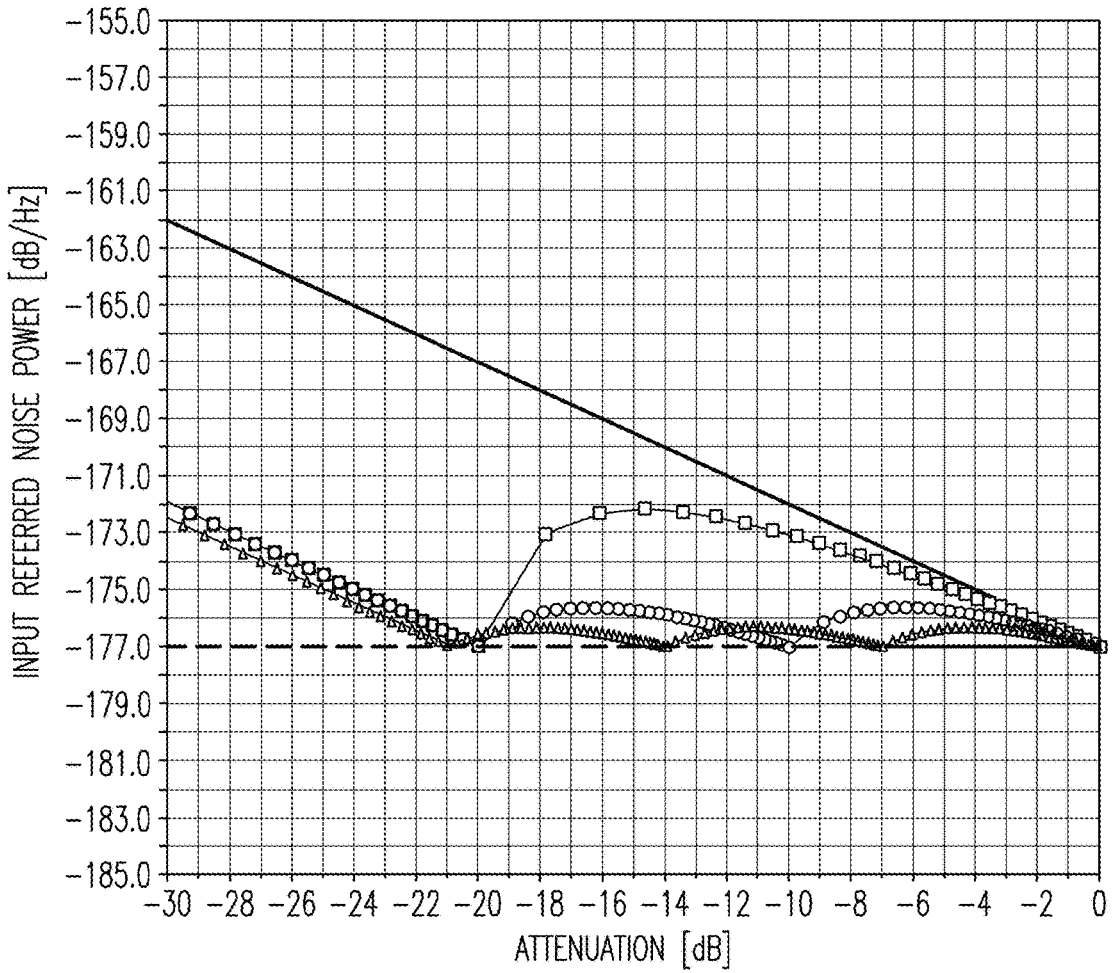
FIG. 6B is a graph of input referred noise power versus attenuation for various examples of VGAs.

FIG. 6B is a graph of input referred noise power versus attenuation for various examples of VGAs. The graph depicts input-referred noise power of a VGA 1-tap attenuator, a VGA 2-tap attenuator, a VGA 3-tap attenuator, and a VGA 4-tap attenuator in dB/Hz versus attenuation.

As shown in FIG. 6B, the VGA 2-tap attenuator provides less than 5 dB of input-referred NSD degradation over a 20 dB attenuation range, while the VGA 3-tap attenuator and the VGA 4-tap attenuator provide less than 2 dB of input-referred NSD degradation over a 20 dB attenuation range.

Although various examples of performance results have been shown, simulation or measurement results can vary based on a wide variety of factors, such as simulation models, simulation tools, simulation parameters, measurement conditions, fabrication technology, and/or implementation details. Accordingly, other results are possible.

Figure 7A:
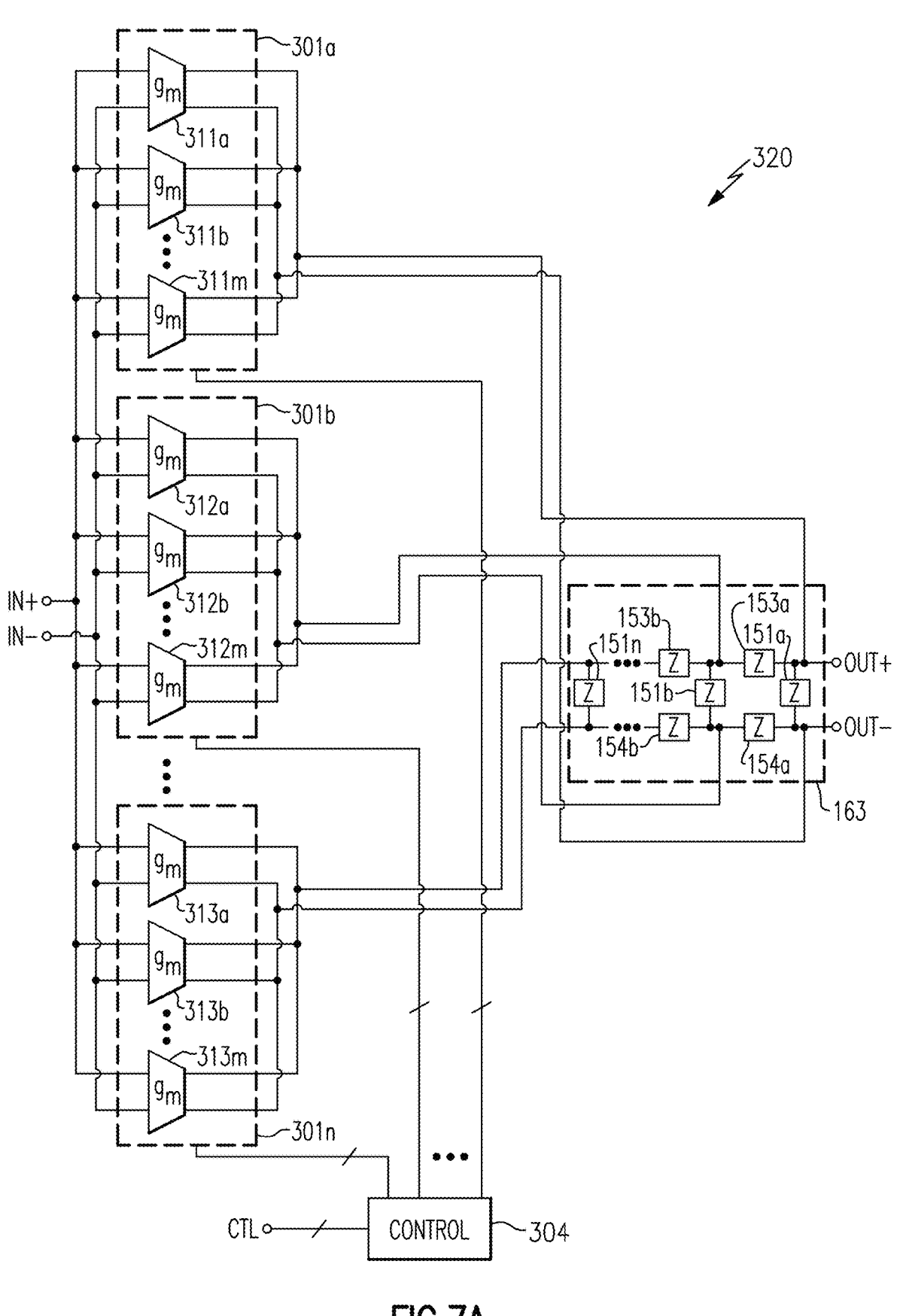
FIG. 7A is a schematic diagram of a VGA according to another embodiment.

FIG. 7A is a schematic diagram of a VGA 320 according to another embodiment. The VGA 320 includes segmented amplification circuits 301a, 301b, . . . 301n, an impedance ladder 163, and a control circuit 304. The VGA 320 receives an RF input signal from a differential input IN+/IN–, and provides an RF output signal to a differential output OUT+/OUT–. The VGA 320 also receives a digital control signal on a control input CTL.

The impedance ladder 163 includes a plurality of taps associated with different impedances through the impedance ladder 163 to the differential output OUT+/OUT−. Each tap is connected to a different node of the impedance ladder 163. As shown in FIG. 7A, the impedance ladder 163 includes first impedances 153*a*/153*b*, second impedances 154*a*/154*b*, and third impedances 151*a*, 151*b*, . . . 151*n*. When the first tap is selected the impedance 151*a* provides signal attenuation. Additionally, when the second tap is selected both the impedance 151*a* and the impedance 151*b* provide signal attenuation. Furthermore, when the nth tap is selected each of the impedances 151*a*, 151*b*, . . . 151*n* provide signal attenuation. Each tap is connected to the output of a corresponding one of the segmented amplification circuits 301*a*, 301*b*, . . . 301*n*. The taps are differential, in this embodiment. The impedances can include resistor, capacitor, and/or inductive components. The impedances can have uniform values or different values to achieve a desired weighting scheme.

The segmented amplification circuit 301*a* includes a plurality amplification cells 311*a*, 311*b*, . . . 311*m* that are electrically connected in parallel between the differential input IN+/IN− and the first tap of the impedance ladder 163. Additionally, the segmented amplification circuit 301*b* includes a plurality amplification cells 312*a*, 312*b*, . . . 312*m* that are electrically connected in parallel between the differential input IN+/IN− and the second tap of the impedance ladder 163. Furthermore, the segmented amplification circuit 301*n* includes a plurality amplification cells 313*a*, 313*b*, . . . 313*m* that are electrically connected in parallel between the differential input IN+/IN− and the nth tap of the impedance ladder 163. The amplification cells are implemented as transconductor circuits, in this embodiment. Such transconductor circuits can include transistors, such as FETs or bipolar transistors providing voltage to current conversion. Any integer m amplification cells can be included for each segmented amplification circuit, where m is greater than or equal to 2. In certain implementations m is at least 4. Any number n taps and corresponding segmented amplification circuits can be included, where n is greater than or equal to 2. The number of taps n can be the same or different from the number of amplification cells m per segmented amplification circuit.

The control circuit 304 processes the digital control signal to operate the VGA 320 with a selected attenuation setting chosen from multiple attenuation settings. The attenuation setting can be chosen based on turning on or off the amplification cells. In certain embodiments, a total number of amplification cells that are turned on is constant as the attenuation setting changes over a range. Thus, different combinations of the amplification cells can be turned on for a given attenuation setting.

Figure 7B:
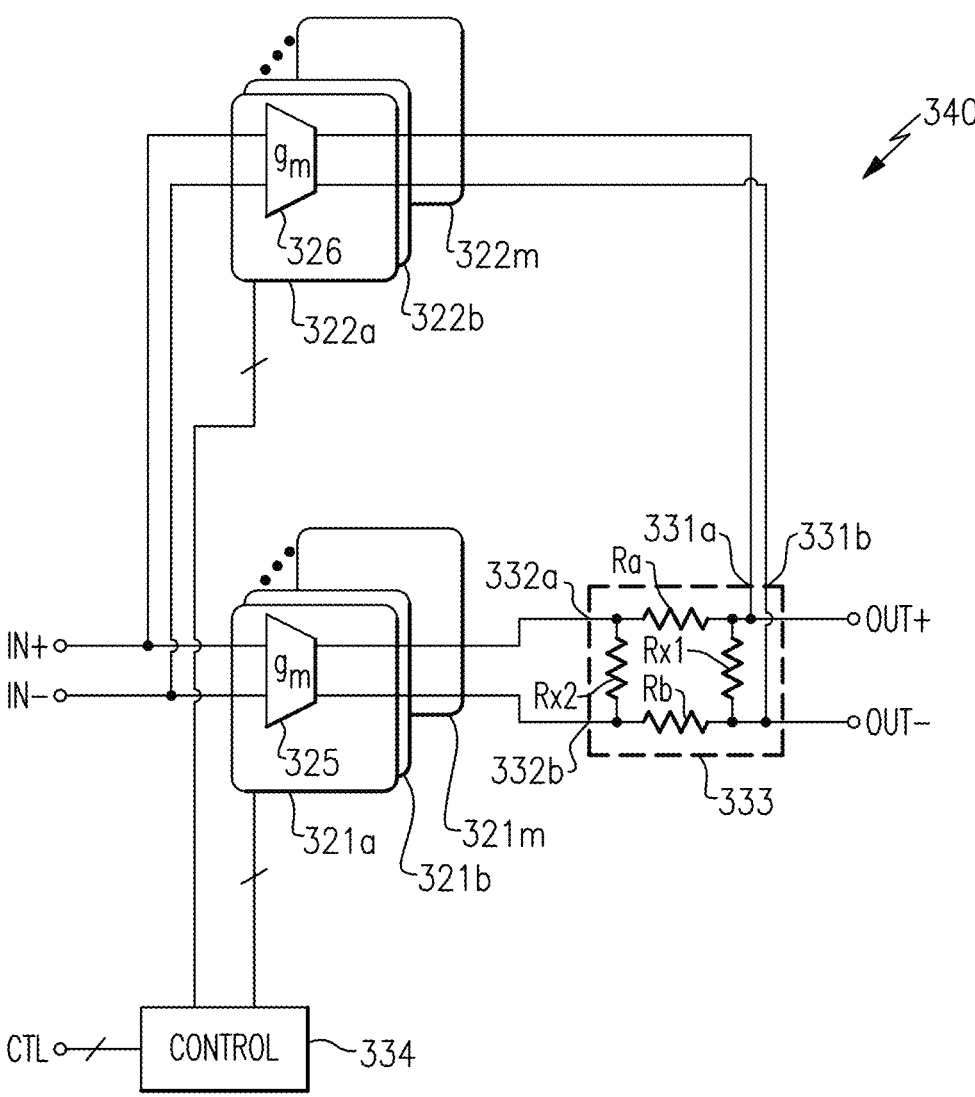
FIG. 7B is a schematic diagram of a VGA according to another embodiment.

FIG. 7B is a schematic diagram of a VGA 340 according to another embodiment. The VGA 340 includes a first segmented amplification circuit including amplification cells 322*a*, 322*b*, . . . 322*m* each including a transconductor circuit 326. The VGA 340 further includes a second segmented amplification circuit including amplification cells 321*a*, 321*b*, . . . 321*m* each including a transconductor circuit 325. The VGA 340 further includes an impedance ladder 333 and a control circuit 334. The VGA 340 receives an RF input signal from a differential input IN+/IN−, and provides an RF output signal to a differential output OUT+/OUT−. The VGA 340 also receives a digital control signal on a control input CTL.

The impedance ladder 333 includes resistors Ra, Rb, Rx1, and Rx2 as well as a first tap 331*a*/331*b* and a second tap

332*a*/332*b*. As shown in FIG. 7B, the amplification cells 322*a*, 322*b*, . . . 322*m* are connected in parallel between the input IN+/IN− and the first tap 331*a*/331*b*. Additionally, the amplification cells 321*a*, 321*b*, . . . 321*m* are connected in parallel between the input IN+/IN− and the second tap 331*a*/331*b*.

The control circuit 334 turns on or off individual ones of the amplification cells 322*a*, 322*b*, . . . 322*m* and amplification cells 321*a*, 321*b*, . . . 321*m* to activate the VGA 340 with a given attenuation setting. In certain implementations, a constant number of amplification cells are turned on for each VGA attenuation setting.

Applications

Devices employing the above described schemes can be implemented into various electronic devices. Examples of electronic devices include, but are not limited to, RF communication systems, consumer electronic products, electronic test equipment, communication infrastructure, etc. For instance, one or more VGAs can be included in a wide range of RF communication systems, including, but not limited to, radar systems, base stations, mobile devices (for instance, smartphones or handsets), phased array antenna systems, laptop computers, tablets, and/or wearable electronics.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A variable gain amplifier (VGA) comprising:

an input configured to receive a radio frequency (RF) input signal;

a segmented amplification circuit including a plurality of amplification cells configured to amplify the RF input signal to generate a plurality of amplified RF signals at a plurality of outputs;

an impedance ladder including a plurality of taps each connected to a different node of the impedance ladder; and a plurality of switches connected between the plurality of outputs of the segmented amplification circuit and the plurality of taps of the impedance ladder, the plurality of switches configured to control routing of the plurality of amplified RF signals from the plurality of outputs of the segmented amplification circuit to one or more taps selected from the plurality of taps of the impedance ladder.

2. The VGA of claim 1, wherein the impedance ladder is configured to provide an RF output signal to an output, wherein the plurality of taps provide different amounts of impedance through the impedance ladder to the output.

3. The VGA of claim 1, wherein the impedance ladder includes a plurality of resistors.

4. The VGA of claim 1, wherein the impedance ladder is segmented into a plurality of impedance ladder segments each connected to a corresponding one of the plurality of amplification cells through the plurality of switches.

5. The VGA of claim 1, wherein the plurality of amplification cells comprises a plurality of transconductor circuits configured to receive the RF input signal as an RF input voltage and to output the plurality of amplified RF signals as a plurality of RF output currents.

6. The VGA of claim 1, further comprising a control circuit configured to select the one or more taps to control the VGA to operate in a selected attenuation setting chosen from a plurality of attenuation settings.

7. The VGA of claim 6, wherein all of the plurality of amplification cells amplify the RF input signal for each of the plurality of attenuation settings.

8. The VGA of claim 1, wherein the plurality of amplification cells, the plurality of switches, and the impedance ladder are implemented differentially.

9. A method of variable gain amplification, the method comprising:

receiving a radio frequency (RF) input signal at an input of a variable gain amplifier (VGA);

amplifying the RF input signal using a plurality of amplification cells of a segmented amplification circuit of the VGA to generate a plurality of amplified RF signals at a plurality of outputs of the segmented amplification circuit;

selecting one or more taps from a plurality of taps of an impedance ladder of the VGA; and routing the plurality of amplified RF signals from the plurality of outputs of the segmented amplification circuit to the one or more selected taps of the impedance ladder using a plurality of switches of the VGA, the plurality of switches connected between the plurality of outputs of the segmented amplification circuit and the plurality of taps of the impedance ladder.

10. The method of claim 9, further comprising providing an RF output signal from the impedance ladder to an output of the VGA, wherein the plurality of taps provide different amounts of impedance through the impedance ladder to the output.

11. The method of claim 9, further comprising choosing a first selection of the plurality of taps for a first attenuation setting of the VGA using a control circuit of the VGA, and selecting a second selection of the plurality of taps for a second attenuation setting of the VGA using the control circuit.

12. The method of claim 11, further comprising amplifying the RF input signal using all of the plurality of amplification cells for both the first attenuation setting and the second attenuation setting.

13. A transmitter comprising:

a radio frequency (RF) digital-to-analog converter (DAC) configured to convert a digital input signal into an RF input signal; and a variable gain amplifier (VGA) comprising:

an input configured to receive the RF input signal;

a segmented amplification circuit including a plurality of amplification cells configured to amplify the RF input signal to generate a plurality of amplified RF signals at a plurality of outputs;

an impedance ladder including a plurality of taps each connected to a different node of the impedance ladder; and a plurality of switches connected between the plurality of outputs of the segmented amplification circuit and the plurality of taps of the impedance ladder, the plurality of switches configured to control routing of the plurality of amplified RF signals from the plurality of outputs of the segmented amplification circuit to one or more taps selected from the plurality of taps of the impedance ladder.

14. The transmitter of claim 13, wherein the impedance ladder is segmented into a plurality of impedance ladder segments each connected to a corresponding one of the plurality of amplification cells through the plurality of switches.

15. The transmitter of claim 13, further comprising a control circuit configured to select the one or more taps to control the VGA to operate in a selected attenuation setting chosen from a plurality of attenuation settings.

16. The transmitter of claim 15, wherein all of the plurality of amplification cells amplify the RF input signal for each of the plurality of attenuation settings.

17. The transmitter of claim 13, wherein the impedance ladder is configured to provide an RF output signal to an output of the VGA, wherein the plurality of taps provide different amounts of impedance through the impedance ladder to the output.

18. The transmitter of claim 17, further comprising an output impedance matching circuit connected to the output.

19. The transmitter of claim 13, further comprising a low pass filter electrically connected between the RF DAC and the VGA and operable to filter the RF input signal.

20. The transmitter of claim 13, wherein the plurality of amplification cells comprises a plurality of transconductor circuits configured to receive the RF input signal as an RF input voltage and to output the plurality of amplified RF signals as a plurality of RF output currents.

* * * * *